United States Patent [19]
Loh et al.

[11] Patent Number: 5,646,578
[45] Date of Patent: Jul. 8, 1997

[54] WIDE DYNAMIC RANGE POWER AMPLIFIER

[75] Inventors: Koon Whye Loh, Mendham; Yatish Swarup Pathak, Fanwood, both of N.J.

[73] Assignee: Lucent Technologies Inc., Murray Hill, N.J.

[21] Appl. No.: 688,415

[22] Filed: Jul. 30, 1996

Related U.S. Application Data

[63] Continuation of Ser. No. 366,081, Dec. 29, 1994, abandoned.

[51] Int. Cl.$^6$ ............................................. H03G 3/30
[52] U.S. Cl. ................................. 330/279; 330/284
[58] Field of Search .............................. 330/129, 279, 330/284; 455/126, 127

[56] References Cited

U.S. PATENT DOCUMENTS

| | | | |
|---|---|---|---|
| 4,709,403 | 11/1987 | Kikuchi | 455/126 |
| 5,150,075 | 9/1992 | Hietala et al. | 330/279 |
| 5,204,637 | 4/1993 | Trinh | 330/129 |
| 5,208,550 | 5/1993 | Iwane | 330/129 |

*Primary Examiner*—Steven Mottola

[57] ABSTRACT

The present invention is directed to a wide dynamic range power amplifier having a power amplification circuit for increasing the power of an incoming signal to an output power suitable for transmitting the signal over a communication medium, and a feedback circuit coupled between the output and gain control input of the power amplification circuit for changing the output power to a new, desired output power.

The feedback circuit may include a digital step attenuator, a power detector, a reference D.C. voltage, and a comparator. To change the output power, the digital step attenuates the output power sensed by the power detector, from a first attenuation level to a second attenuation level, by an amount corresponding to the desired change in output power. The power conversion circuit converts the output power at the second attenuation level to a D.C. voltage for comparison with the reference D.C. voltage which corresponds to the output power at the first attenuation level. The comparator increases the gain of the power amplification circuit, and thereby the output power, by an amount corresponding to the difference between the D.C. voltage and the reference D.C. voltage, until the D.C. voltage equals the reference D.C. voltage.

12 Claims, 2 Drawing Sheets

WIDE DYNAMIC RANGE POWER AMPLIFIER

This application is a continuation of application Ser. No. 08/366,081 filed on Dec. 29, 1994, now abandoned.

FIELD OF THE INVENTION

The present invention relates generally to power amplifiers, and more particularly to power amplifiers capable of accurate power level settings over a wide dynamic range.

BACKGROUND OF THE INVENTION

Power amplifiers are commonly used as general purpose transmitters for wireless base-stations and handsets. In these applications, the power amplifier serves to change the power of an incoming signal to an output power suitable for transmitting the signal over a communication medium, such as the electromagnetic frequency spectrum in the case of a modulated RF carrier.

The power of a signal is directly proportional to the amplitude or voltage level of the signal ($P=V^2/R$) and is typically expressed in dBm units, which represent the logarithmic power of the signal with respect to 1 mW, (P in dBm units=$20 \log_{10}(V/1^{-3})$). The change in power of a power amplifier is expressed in decibel (dB) units, (P change in dB units=$20 \log_{10}(V_{out}/V_{in})$). For example, a +6 dB change in power represents a gain in power by a factor of 2; a +20 dB change in power represents a gain in power by a factor of 10; and a +40 dB change in power represents a gain in power by a factor of 20. Negative dB changes in power represent reductions in power by an inverse factor. For example, −6 dB, −20 dB, and −40 dB, represent reductions in power by factors of 1/2, 1/10, and 1/20, respectively.

To maintain a desired output power over time, the power of the outgoing signal is continuously monitored and adjusted by a feedback circuit operably coupled between the output and gain control input of the power amplifier. The feedback circuit increases or decreases the gain of the power amplifier, and thereby the power of the signal, by an amount corresponding to the change in power needed to correct for fluctuations in the output power. These fluctuations are normally caused by environmental changes, such as changes in temperature, or spurious changes in the power of the incoming signal.

In more detail, the amplitude of the outgoing signal is first rectified and integrated by a power detector and loop filter in the feedback circuit to obtain a D.C. voltage which corresponds to the actual output power of the signal. The D.C. voltage is then compared by a comparator with a reference D.C. voltage which corresponds to the desired output power. The comparator outputs a D.C voltage to the gain control input of the power amplifier which corresponds to the difference between the output power D.C. voltage and the reference D.C. voltage. This feedback signal from the comparator serves to increase or decrease the gain of the power amplifier to correct fluctuations in the output power from its desired level, and thereby maintain the power of the outgoing signal at the desired power level.

Beyond maintaining a desired output power over time, existing transmitter applications also require that the output power be changed to different, discrete levels over varying ranges in power. One way to change the output power is to change the reference D.C. voltage from one which corresponds to the present output power to one which corresponds to the new, desired output power. In this way, the difference between the D.C. voltage and the reference D.C. voltage will correspond to the increase or decrease in gain required to change the output power of the outgoing signal to the new desired output power.

This method is problematic for transmitter applications having wide dynamic ranges because of the small dynamic range of the typical, off-the-shelf power detector, which is often on the order of 10 dB. The dynamic range of a power amplifier or power detector is the maximum dB range in power which the amplifier or detector can operate over without unacceptable levels of error.

In other words, because the voltage-current characteristic curve associated with the typical power detector is non-linear, the output power sensed by the power detector cannot change by more than 10 dB without unacceptable levels of error, whereby the power detector produces a D.C. voltage which does not correspond to the actual output power—for example, it does not correspond to within 1 dbm as required by the IF-54 standard for base station transmitters. Transmitter applications, on the other hand, often require that the output power change by more than 10 dB, in other words, over a wide dynamic range.

Briefly, by way of example, to change the output power from 10 dBm to 25 dBm, a 15 dB change, the reference D.C. voltage input to the comparator is changed from a 10 dBm voltage to a 25 dBm voltage. Assuming that the power detector has a 2 dBm error outside its 10 dB dynamic range, the power detector will only output a 23 dBm D.C. voltage to the feedback input of the comparator. To maintain equality between its two inputs, the comparator will increase the gain of the power amplifier and thus the output power by another 2 dBm, to 27 dBm, so that a 25 dBm D.C. voltage (the 27 dBm output power minus the 2 dBm error) is input to the comparator. This leaves the output of the power amplifier at the wrong power level of 27 dBm.

One way to compensate for the error associated with the power detector outside its dynamic range is to adjust or calibrate the reference voltage. For the above example, the reference voltage would be adjusted or calibrated to a 23 dBm voltage, rather than a 25 dBm voltage, when a 25 dBm output power is desired. Since the error associated with the power detector is not fixed, in order to make these adjustments or calibrations for each of the different power levels over a wide dynamic range, a number of additional components must be added to the feedback circuit, increasing the complexity and cost of the power amplifier, and decreasing its reliability.

SUMMARY OF THE INVENTION

In one embodiment of the present invention, a power amplifier is provided which does not require calibrations or adjustments to the reference D.C. voltage to change the output power to different output power levels over a wide dynamic range. As a result, the number of components required to operate the power amplifier are greatly reduced, resulting in a less complex, lower cost, more reliable wide dynamic range power amplifier.

This wide dynamic range power amplifier includes a power amplification circuit for transmitting a signal at an output power, and a feedback circuit which changes the output power by changing the corresponding D.C. voltage, not the reference D.C. voltage. To change the D.C. voltage, the feedback circuit may suitably include a digital step attenuator coupled to the input of a power detector for attenuating the output power sensed by the power detector, from a first attenuation level to a second attenuation level, by an amount corresponding to the change in output power desired.

A power conversion circuit, including a power detector in combination with a loop filter or integrator, converts the output power at the second attenuation level to a corresponding D.C. voltage. The D.C. voltage is then compared by a comparator to a reference D.C. voltage corresponding to the output power at the first attenuation level.

Next, the comparator changes the output power by an amount corresponding to the difference between the D.C. voltage and the reference D.C. voltage. If the new output power is not at the desired power level because of the error associated with the small dynamic range of the power detector, the comparator will continue to servo until the D.C. voltage equals the reference D.C. voltage, and, as a result, the output power is at the desired level. This is possible because the D.C. voltage corresponding to the new output power at the second attenuation level will represent a change at the input to the power detector which is within its dynamic range, as explained further in the Detailed Description of the Invention.

In an alternative embodiment, a digital variable gain amplifier is used in place of the digital step attenuator to amplify the output power, from a first amplification level to a second amplification level, by an amount corresponding in opposite polarity to the desired change in output power. In this embodiment, the comparison is between a D.C. voltage corresponding to the output power at the second amplification level, and a reference D.C. voltage corresponding to the output power at the first amplification level. Otherwise, the operation of the two embodiments is the same.

Because the feedback circuit of the present invention operates over a wide dynamic range in power, the power amplification circuit preferably should also operate over the same wide dynamic range. But this may leave the gain control input of the power amplification circuit prone to AM modulation as a result of spurious changes in the difference signal from the comparator of the feedback circuit. A further embodiment of the present invention greatly reduces the sensitivity of the power amplification circuit by eliminating the need for the gain control input of the power amplification circuit to change over a wide dynamic range, and thereby allowing the power amplifier to use a power amplification circuit having a small dynamic range.

In this further embodiment, a second digital step attenuator is operably coupled to the input of the power amplification circuit for attenuating the input power, from a first attenuation level to a second attenuation level, by an amount in opposite polarity to the change in output power desired. The attenuation of the input power to the second attenuation level occurs simultaneously with the attenuation of the output power to the second attenuation level. In this way, the input power is changed to the level of the desired output power, meaning that the gain of the power amplification circuit will only need to change to compensate for the small power changes associated with environmental changes. Thus, a power amplification circuit with a small dynamic range can be used with the present invention, eliminating its sensitivity to spurious signals over a wide dynamic range.

Other embodiments of this further embodiment include replacing the second digital step attenuator with a digital variable gain amplifier which amplifies the input power by an amount corresponding to the change in output power desired.

DETAILED DESCRIPTION OF THE INVENTION

Figure 1:
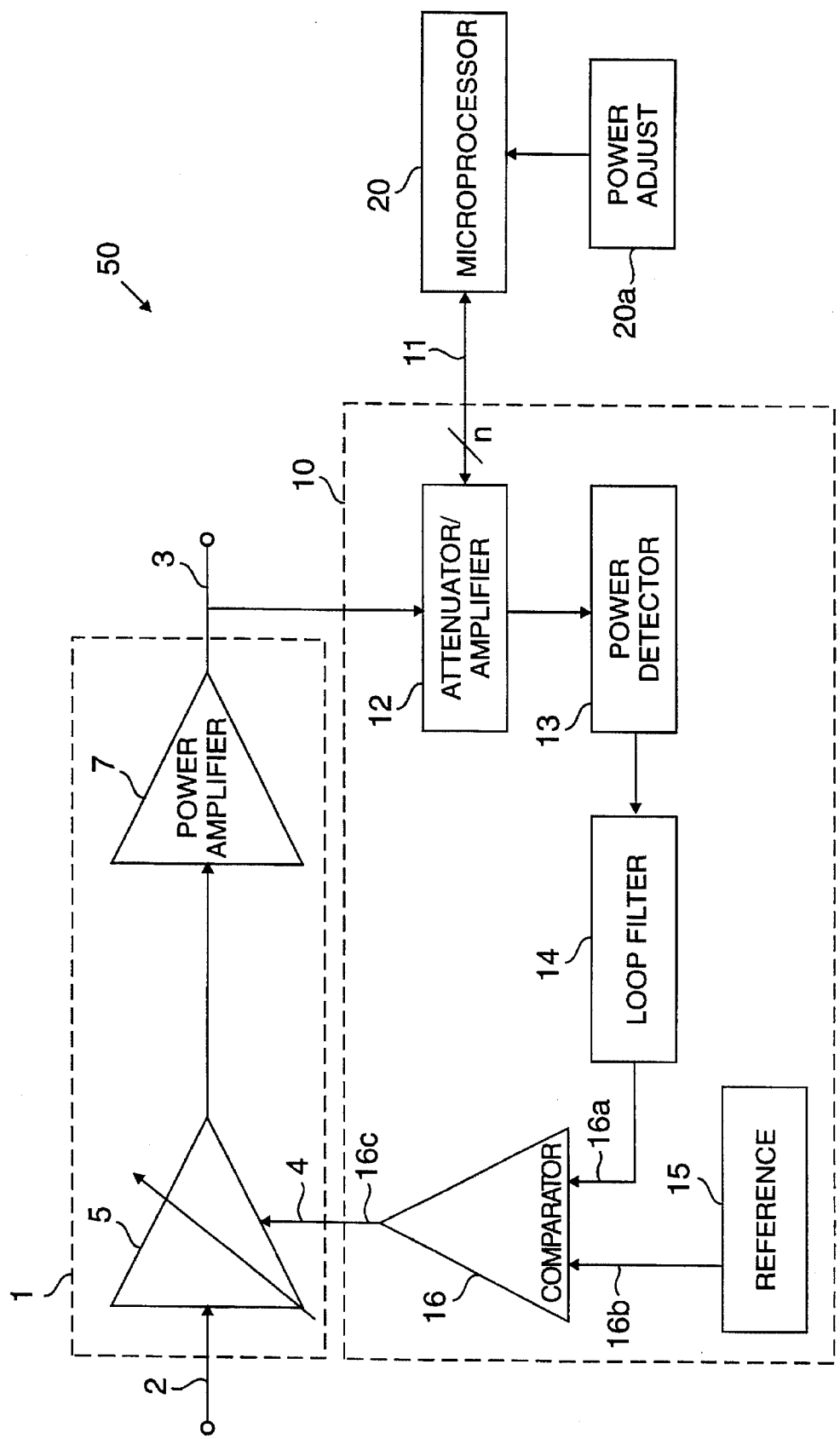
FIG. 1 is a block diagram of one embodiment of a wide dynamic range power amplifier according to the present invention.

FIG. 1 shows one example of a wide dynamic range power amplifier 50 according to the present invention. This embodiment of the present invention includes a power amplification circuit 1 and a feedback circuit 10 under control of a digital control means.

The digital control means may include microprocessor 20 and power adjust input device 20a, but many other alternatives are known to those of ordinary skill in the art. For example, the microprocessor could be replaced by a minicomputer, mainframe, or any other suitable kind of digital controller. The power adjust input device 20a may include such things as a keypad, touch screen, RF transmitter, or any other mechanism capable of instructing a digital controller to change the output power to a certain level, such as a firmware program which is executed upon "power up" of the transmitter.

The power amplification circuit 1 shown in FIG. 1 includes an analog variable gain amplifier 5 preceding the power amplifier 7 for receiving an input signal on line 2, but alternatively, just the power amplifier 7 may be used. The power amplification circuit 1 serves to increase or decrease the power of an incoming signal on line 2 to an outgoing signal with an output power suitable for transmitting the signal over a communication medium, such as the electromagnetic frequency spectrum in the case of an RF signal. The outgoing signal is transmitted at the output power from the power amplifier 7 on line 3.

The feedback circuit 10 functions to change the output power to any of the different, discrete power levels selected via the power adjust input device 20a. Specifically, the feedback circuit includes a digital step attenuator 12 for attenuating the power of the outgoing signal in response to the digital control means, from a first attenuation level to a second attenuation level, by an amount corresponding to the change in output power needed for the selected output power. For example, to change the output power from 10 dBm to 15 dBm, representing a change of 5 dB, the attenuation of the digital step attenuator is increased by 5 dB by microprocessor 20, from a first attenuation level, for example 0 dB, to a second attenuation level of 5 dB, which is 5 dB higher.

Continuing with this example to explain FIG. 1, the output power at the second attenuation level, namely 5 dBm (the present output power of 10 dBm minus the second attenuation level of 5 dB) is converted to a corresponding D.C. voltage by a power conversion circuit, such as the power detector 13 and loop filter 14 shown in FIG. 1. Specifically, the power detector 13 and loop filter 14 serve to fully rectify and integrate the outgoing signal to output a D.C. voltage which corresponds to the output power of the outgoing signal at the second attenuation level. The power detector is suitably a diode detector, but alternative devices can be used as known to those of ordinary skill in the art. The loop filter is also just one example of a suitable integrating device.

Next, the 5 dBm D.C. voltage, representing the output power at the second attenuation level, is compared by a comparator 16 to a reference D.C. voltage 15. The reference D.C. voltage is the D.C. voltage corresponding to the output power at the first attenuation level, which, in this example, is a D.C. voltage corresponding to 10 dBm (10 dBm output power minus the first attenuation level of 0 dB). The difference between the 5 dBm D.C. voltage at the feedback input 16a to the comparator and the 10 dBm reference D.C. voltage at the reference input 16b is 5 dBm.

Because the comparator seeks to maintain equality between its two inputs, it will change the gain of the power amplification circuit 1 by an amount corresponding to the 5 dBm difference between its two inputs, which, in turn, will change the output power from 10 dBm to 15 dBm, the desired output power. The D.C. voltage output from the power detector, corresponding to the new 15 dBm output power at the second attenuation level, will be a 10 dBm D.C. voltage, which equals the 10 dBm reference D.C. voltage. The comparator will not change the output power again because its two inputs are now equal.

In more detail, to change the output power, the comparator changes the gain of the analog variable gain amplifier 5 of the power amplification circuit. In other applications, the gain of the power amplifier 7 could be changed instead. As show in FIG. 1, the output 16c of the comparator is operably coupled to the gain control input 4 of the power amplification circuit 1, which, in turn, is operably coupled to the gain control input of the analog variable gain amplifier 5.

The present example changed the output power by 5 dB which is within the dynamic range of the typical power detector, meaning that the power detector will output a D.C. voltage which is proportional to the output power sensed at its input. The advantage of the present invention over the prior art devices discussed in the Background of the Invention occurs when the output power needs to be changed by more than the dynamic range of the power detector, which is typically on the order of 10 dB. In other words, one significant advantage of the present over the prior art devices discussed in the Background is in wide dynamic range applications.

This advantage is illustrated by the following example. Assume that the dynamic range of the power detector 13 is 10 dB. Also, assume that the output power has initially been set at 10 dBm, that the first attenuation level of the digital step attenuator 12 is 0 dB, and that the reference D.C. voltage 15 is 10 dBm (the output power of 10 dBm minus the 0 dB first attenuation level). Finally, assume that the output power needs to be changed this time by 15 dB, from 10 dBm to 25 dBm, which is beyond the 10 dB dynamic range of the power detector, meaning that the power detector will output a D.C. voltage with an unacceptable level of error. Assume the error is 2 dBm.

With these assumptions, the user will first select 25 dBm as the new desired output power by way of the power adjust input device 20a. Alternatively, this new desired output power might be set by a signal from a base station or the like. In response to that selection, the microprocessor 20 will increase the attenuation of the digital step attenuator by 15 dB, from 0 dB (the first attenuation level) to 15 dB (the second attenuation level). The 15 dB attenuation level will, in turn, decrease the output power sensed by the power detector from 10 dBm, the output power at the first attenuation level, to −5 dBm, the output power at the second attenuation level.

Because the input to the power detector has changed by more than 10 dB, the power detector and loop filter will not output a D.C. voltage which corresponds to −5 dBm. Instead, the D.C. voltage will correspond to only −3 dBm, because of the power detector's 2 dBm error. The comparator, in turn, seeking to maintain equality between its two inputs, will only increase the gain of the power amplification circuit 1 by 13 dBm, the difference between the −3 dBm D.C. voltage and the 10 dBm reference voltage. In response to the 13 dB increase in the gain of the power amplification circuit 1, the output power will increase from 10 dBm to a new output power of 23 dBm, which is 2 dBm less than the desired power level.

Unlike the prior art devices discussed in the Background of the Invention, the feedback circuit of the present invention will continue to servo to correct the 2 dBm error because the new 23 dBm output power at the 15 dB second attenuation level is 8 dBm, which is within the 10 dB dynamic range of the power detector. In other words, 8 dBm represents only a 2 dB change from the 10 dBm output power sensed prior to the increase in attenuation. Because the change is within the dynamic range of the power detector, the power detector will output a D.C. voltage to the comparator which corresponds to 8 dBm.

The comparator, to maintain equality between its two inputs, will increase the gain of the power amplifier another 2 dBm, which, in turn, will increase the output power from 23 dBm to the desired output power of 25 dBm. The detector will now see 10 dBm (the 25 dBm output power minus the 15 dB second attenuation level) at its input and will output a 10 dBm voltage to the feedback input of the comparator. Because the two inputs to the comparator are now equal, the output power will remain at the desired 25 dBm level.

Thus, the power amplifier of the present invention is not limited by the dynamic range of the power detector, and unlike the prior art devices which compensate for the error, the present invention corrects the error. As a result, the problem associated with the power detector is solved without the complexity, cost, and decrease in reliability associated with the prior art solution of adjusting the reference voltage to compensate for the error.

An alternative embodiment of the present invention could use a digital variable gain amplifier 12 as indicated in FIG. 1, in place of the digital step attenuator, at the input to the power detector for changing the output power. In the case of the digital variable gain amplifier, the output power is amplified, from a first amplification level to a second amplification level, by an amount in opposite polarity to the change in the output power desired. In other words, the gain of the amplifier is decreased to increase the output power, and increased to decrease the output power.

In this embodiment, the D.C. voltage corresponds to the output power at the second amplification level, and the reference voltage corresponds to the output power at the first amplification. As in the first embodiment, the comparator will increase the output power of the power amplifier by an amount corresponding to the difference between the D.C. voltage and the reference D.C. voltage until the D.C. voltage equals the reference D.C. voltage.

Figure 2:
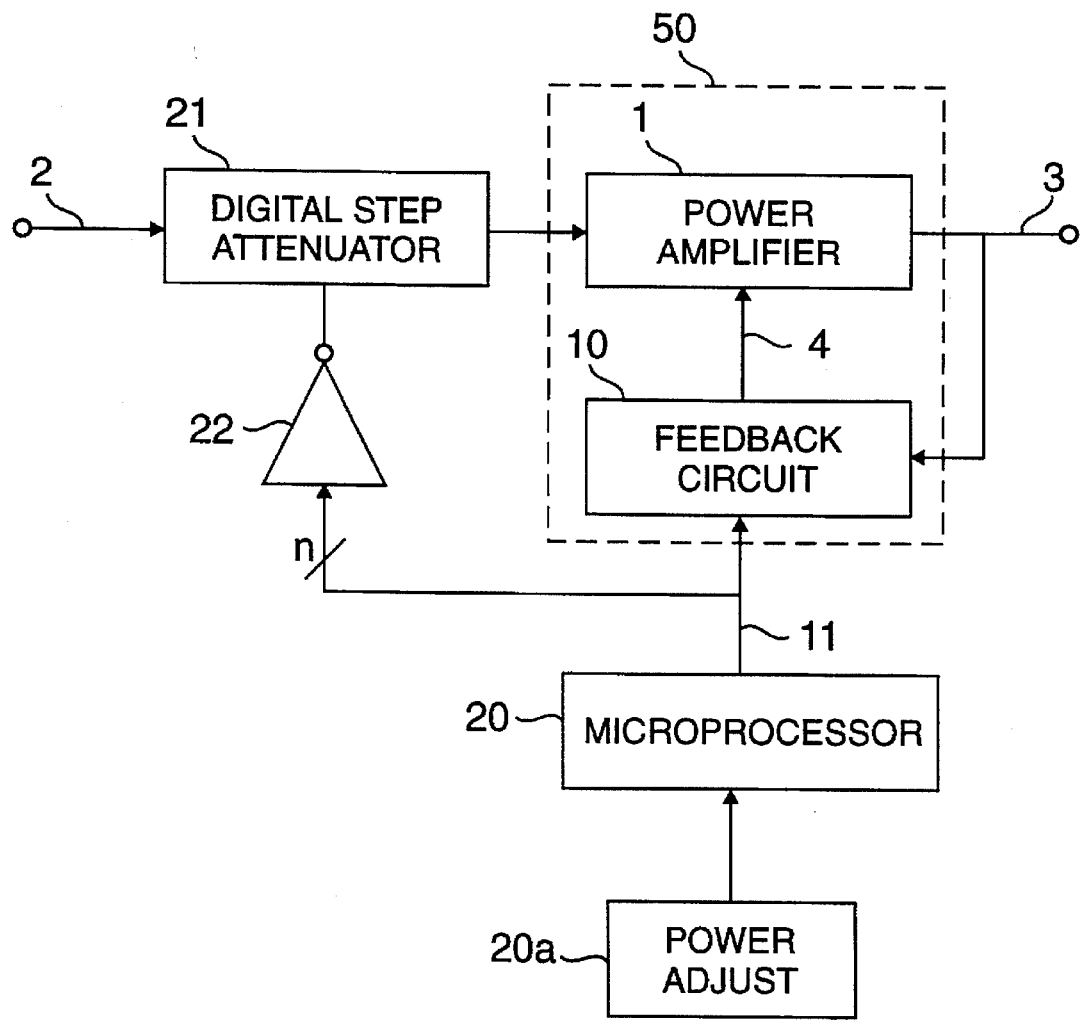
FIG. 2 is a block diagram of a further embodiment of a wide dynamic range power amplifier according to the present invention.

Because the feedback circuit 10 of the present invention changes the gain of the power amplification circuit 1 over a wide dynamic range, the power amplification circuit must be sensitive to changes in the output of the comparator over the same wide dynamic range. As a result, the power amplification circuit 1 is also highly sensitive to spurious signals in the feedback signal over the wide dynamic range, which may leave it prone to unwanted AM modulation. FIG. 2 shows a further embodiment of the present invention which greatly reduces this sensitivity.

Referring to FIG. 2, a second digital step attenuator 21 is operably coupled to the input 2 of the power amplification circuit or power amplifier 1 and operates in a reciprocal manner with the first digital step attenuator 12 of the feedback circuit 10 shown in FIG. 1. The attenuation of the second digital step attenuator 21 is controlled by the same digital control means 20 as the first digital step attenuator 12, but through an inverter, enabling the second attenuator to be controlled in a reciprocal or opposite relationship with the first digital step attenuator. In this way, when the attenuation of the first attenuator is increased, the attenuation of the second attenuator is simultaneously decreased by the same amount. In other words, the attenuation is changed by an amount in opposite polarity to the change in output power desired.

Less attenuation means the input power will increase, and if the increase in attenuation is in opposite polarity to the amount of change in output power desired, the input power will rise to the level of the desired output power. Thus, the power amplification circuit 1 need only have a small dynamic range which accommodates changes resulting from changes in the operating environment, for example temperature changes. With a small dynamic range, the power amplification circuit will have a small sensitivity at its gain control input 4.

There are other suitable alternatives for the embodiment shown in FIG. 2. For example, the second digital step attenuator could be replaced by a digital variable gain amplifier, and the digital control means could directly control the variable gain amplifier, rather than through an inverter, to accomplish the same result. The gain of the second digital variable gain amplifier would be changed by an amount corresponding to the change in output power desired, rather than in opposite polarity thereto.

The present invention is particularly suited for use as a general purpose transmitter in base-station and mobile radios, including F.M. base-station radios, CDMA base-station radios, GSM base-station radios, TDMA base-station radios, and microcellular base-station radios.

Other embodiments and applications for the present invention will be readily apparent to those of ordinary skill in the art, and all such embodiments and applications for the present invention are considered to fall within the scope of the invention as defined by the appended claims.

We claim:

1. A wide dynamic range power amplifier comprising:
    a power amplification circuit having an input power and an output power;
    a first digital step attenuator for attenuating the output power by an amount corresponding to a desired change in the output power;
    a second digital step attenuator for attenuating the input power by an amount in opposite polarity to the desired change in output power, said attenuation of the input power occurring simultaneously with the attenuation of the output power;
    a power conversion circuit for converting the attenuated output power to a corresponding D.C. voltage;
    a reference D.C. voltage corresponding to a reference output power; and
    a comparator for comparing the D.C. voltage to the reference D.C. voltage, wherein the comparator changes the output power of the power amplification circuit by an amount corresponding to the difference between the D.C. voltage and the reference D.C. voltage.

2. The wide dynamic range power amplifier of claim 1, wherein the first and second digital step attenuators are controlled by digital control means.

3. The wide dynamic range power amplifier of claim 2, wherein the digital control means is a microprocessor.

4. The wide dynamic range power amplifier of claim 2, wherein the digital control means is operably coupled directly to the first digital step attenuator and through an inverter to the second digital step attenuator.

5. A method of changing the output power of a power amplifier, comprising the steps of:
    generating an output power from a power amplifier having an input power;
    attenuating the output power by an amount corresponding to a desired change in the output power;
    attenuating the input power by an amount in opposite polarity to the desired change in the output power, said attenuation of the input power occurring simultaneously with the attenuation of the output power;
    converting the attenuated output power to a corresponding D.C. voltage;
    generating a reference D.C. voltage corresponding to a reference output power;
    comparing the D.C. voltage to the reference D.C. voltage; and
    changing the output power by an amount corresponding to the difference between the D.C. voltage and the reference D.C. voltage.

6. A wide dynamic range power amplifier comprising:
    a power amplification means having an input power and an output power;
    means for attenuating the output power by an amount corresponding to a desired change in the output power;
    means for attenuating the input power by an amount in opposite polarity to the desired change in output power, said attenuation of the input power occurring simultaneously with the attenuation of the output power;
    means for converting the attenuated output power to a corresponding D.C. voltage;
    means for generating a reference D.C. voltage corresponding to a reference output power; and
    means for comparing the D.C. voltage to the reference D.C. voltage, wherein the comparison means changes the output power of the power amplification means by an amount corresponding to the difference between the D.C. voltage and the reference D.C. voltage.

7. The wide dynamic range power amplifier of claim 1, wherein said power amplification circuit comprises a power amplifier, and wherein said comparator changes the gain of the power amplification circuit by changing the gain of the power amplifier by an amount corresponding to the difference between the D.C. voltage and the reference D.C. voltage.

8. The wide dynamic range power amplifier of claim 1, wherein said power amplification circuit comprises a variable gain amplifier and a power amplifier, and wherein said comparator changes the output power of the power amplification circuit by changing the gain of the variable gain amplifier by an amount corresponding to the difference between the D.C. voltage and the reference D.C. voltage.

9. The method of claim 5, wherein the step of changing the output power includes changing the output power by changing the gain of the power amplifier by an amount corresponding to the difference between the D.C. voltage and the reference D.C. voltage.

10. The method of claim 5, wherein the output power of said power amplifier is controlled by a variable gain amplifier and wherein said step of changing the output power includes changing the gain of the variable gain amplifier by an amount corresponding to the difference between the D.C. voltage and the reference D.C. voltage.

11. The wide dynamic range power amplifier of claim 6, wherein the power amplification means comprises a power amplifier, and wherein said comparison means changes the output power of the power amplification means by changing the gain of the power amplifier by an amount corresponding to the difference between the D.C. voltage and the reference D.C. voltage.

12. The wide dynamic range power amplifier of claim 6, wherein the power amplification means comprises a variable gain amplifier and a power amplifier, and wherein said comparison means changes the output power of the power amplification means by changing the gain of the variable gain amplifier by an amount corresponding to the difference between the D.C. voltage and the reference D.C. voltage.

* * * * *